(12) United States Patent
Laaser

(10) Patent No.: US 6,498,573 B2
(45) Date of Patent: Dec. 24, 2002

(54) SIGMA-DELTA A/D CONVERTER

(75) Inventor: Peter Laaser, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/067,099

(22) Filed: Feb. 4, 2002

(65) Prior Publication Data

US 2002/0140591 A1 Oct. 3, 2002

Related U.S. Application Data

(63) Continuation of application No. PCT/DE00/02570, filed on Aug. 2, 2000.

(30) Foreign Application Priority Data

Aug. 4, 1999 (DE) .......................... 199 36 677

(51) Int. Cl.[7] .............................................. H03M 3/00
(52) U.S. Cl. ...................................................... 341/143
(58) Field of Search ................................. 341/143, 123, 341/131, 144, 155

(56) References Cited

U.S. PATENT DOCUMENTS

| | | | | |
|---|---|---|---|---|
| 5,461,381 A | | 10/1995 | Seaberg | 341/143 |
| 5,729,232 A | | 3/1998 | Fujimori | 341/172 |
| 6,388,597 B1 | * | 5/2002 | Maezawa | 341/143 |
| 6,424,279 B1 | * | 7/2002 | Kim | 341/143 |

FOREIGN PATENT DOCUMENTS

| | | | | |
|---|---|---|---|---|
| DE | 4328974 | 8/1994 | .......... | H03H/19/00 |
| DE | 4441043 | 12/1995 | ............ | H03M/3/02 |
| DE | 69219506 | 11/1997 | ............ | H03M/1/52 |

OTHER PUBLICATIONS

Fujimori, I et al., "1.5 V, 4.1 MW Dual–Channel Audio Delta–Sigma D/A Converter," IEEE Journal of Solid–State Circuits, IEEE Inc. New York, vol. 33, No. 12, Dec. 1998, pp. 1863–1870, XP000880487.

Ribner, David B. et al., "A Third–Order Multistage Sigma–Delta Modulator with Reduced Sensitivity to Nonidealities," IEEE Journal of Solid–State Circuits, vol. 24, No. 12, Dec. 1991, pp. 1764–1774, XP002165521.

* cited by examiner

Primary Examiner—Brian Young
(74) Attorney, Agent, or Firm—Withrow & Terranova, P.L.L.C.

(57) ABSTRACT

Sigma-delta A/D converter having at least one analog signal input (1, 2) for applying an analog input signal, a subtraction element (3) having a plurality of capacitors (20) for sampling the input signal during a sampling phase, it being possible during an integration phase to switch the capacitors (20) to reference voltage sources (7, 8, 9) depending on control signals, an integrator (10) for integrating the output signal of the subtraction element (3) during the integration phase, a quantizer (13) for analog-to-digital conversion of the output signal of the integrator (10) for outputting a digitized output signal to a digital signal output (14), and having a control logic element (16) for generating the control signals in such a way that the current load of the reference voltage sources (7, 8, 9) is minimized during the integration phase.

14 Claims, 4 Drawing Sheets

SIGMA-DELTA A/D CONVERTER

This application is a continuation of international application number PCT/DE00/02570, filed Aug. 2, 2000, currently pending, which claims the benefit of German application 19936677.2, filed on Aug. 4, 1999, currently pending.

The invention relates to a sigma-delta A/D converter with minimal current load of the reference voltage sources.

FIG. 1 shows a block circuit diagram of a sigma-delta A/D converter according to the prior art. The sigma-delta A/D converter receives an analog input signal at the input E, which is fed to a subtraction element S. In the subtraction element S the output signal of a multi-bit D/A converter is subtracted from the analog input signal and is fed to an integrator. The integrator integrates the input signal and outputs the integrated signal to a quantizer. The quantizer is an analog-to-digital converter with a low resolution which outputs the digitized output signal to an output A of the sigma-delta A/D converter. The digitized output signal is connected via a feedback line to the input of the multi-bit D/A converter. The digitized output signal of the quantizer is converted by the multi-bit D/A converter into an analog signal and is subtracted in the subtraction element S from the input signal at the input E.

FIG. 2 shows an embodiment of a sigma-delta A/D converter employing SC circuitry (SC switched capacities: switchable capacitors). The prior art sigma-delta A/D converter shown in FIG. 2 is a fully differential sigma-delta A/D converter having two signal inputs $V_{INA}$ and $V_{INB}$. Also provided are reference voltage sources $V_{REFP}$ and $V_{REFN}$ which can be connected by controllable switching devices to capacitors $C_{1A}, C_{2A}, \ldots C_{LA}$ as well as capacitors $C_{1B}, C_{2B}, \ldots C_{LB}$. The capacitors may furthermore be connected by switching devices to the analog signal inputs $V_{INA}, V_{INB}$.

On the output side, the capacitors $C_{1A}, C_{2A}, \ldots C_{LA}$ as well as $C_{1B}, C_{2B}, \ldots C_{LB}$ can be connected by switching devices n and a common ground line to ground $V_{GND}$ or to an integrator.

In the sigma-delta A/D converter shown in FIG. 2, the integrator contains an operational amplifier with one inverting and one non-inverting input as well as two output lines, with integration capacitors CINT being connected between the signal inputs and signal outputs of the operational amplifier in each case. Connected downstream of the integrator is a quantizer for analog-to-digital conversion of the voltage between the two output lines of the operational amplifier. The digitized signal present at the output of the quantizer is fed via a feedback line to a control logic element which supplies control signals for controlling the switching devices.

During a sampling phase PHl1, the capacitors $C_{1A}, C_{2A}, C_{LA}$ are connected by switches on the one hand to the first analog input line $V_{INA}$ and on the other hand to ground $V_{GND}$. During the sampling phase PHL1, the capacitors $C_{1B}, C_{2B}, \ldots C_{LB}$ are connected by switching devices on the one hand to the second analog input signal $V_{INB}$ and on the other hand to ground $V_{GND}$. During the sampling phase, all switches indicated by "PHL1" in FIG. 2 are closed.

Upon completion of the sampling phase PHL1, the switches indicated by PHl1 in FIG. 2 are opened and the capacitors $C_{1A}, C_{2A}, \ldots C_{LA}$ are connected by the switches indicated by PHL2 to the non-inverting input (+) of the operational amplifier and to the first integration capacitor CintA for charge transfer. At the same time, the capacitors $C_{1B}, C_{2B}, \ldots C_{LB}$ are switched by the switches indicated by PHL2 to the inverting input (−) of the operational amplifier and to the second integration capacitor $C_{intB}$ for charge transfer. At the same time, in each case the left capacitor plates of the capacitors $C_{1A}, C_{2A}, \ldots C_{LA}$ and $C_{1B}, C_{2B}, \ldots C_{LB}$ are connected to the reference voltage source $V_{REFP}$ or to the reference voltage source $V_{REFN}$ respectively in accordance with the control instructions generated by the control logic element.

Upon completion of the integration phase PHL2, an output voltage $V_{OUTP}(i)$ is present at the output of the integrator, i.e. between the two output lines of the operational amplifier, which output voltage depends on the preceding value $V_{OUTP}(i-1)$, the analog input voltage $V_{INA}(i-\frac{1}{2})$, the number of capacitors $C_{jA}$ whose left capacitor plate is connected to the positive reference voltage source $V_{REFP}$ during the integration phase, and the number n (i) of capacitors $C_{jA}$ whose left capacitor plate is connected to the negative reference voltage source $V_{REFN}$ during the integration phase.

The output voltage $V_{OUTP}(i)$ is obtained here using the following equation:

$$V_{OUTP}(i) = V_{OUTP}(i-1) + V_{INA}(i-1/2) \cdot \frac{L \cdot C_{jA}}{C_{int}} - p(i) \cdot |V_{REFP}| \cdot \frac{C_{jA}}{C_{int}} + \quad (1)$$

$$n(i) \cdot |V_{REFN}| \cdot \frac{C_{jA}}{C_{int}} = = V_{OUTP}(i-1) + V_{INA}(i-1/2) \cdot \frac{L \cdot C_{jA}}{C_{int}} -$$

$$(p(i) - n(i)) \cdot V_{REF} \cdot \frac{C_{jA}}{C_{int}} \text{ with } V_{REF} = |V_{REFP}| = |V_{REFN}|;$$

The number of capacitors $C_{jA}$ whose left capacitor plate is connected to the positive reference voltage source $V_{REFP}$ during the integration phase is obtained here using the following equation:

$$p(i) = \text{round}\left[L/2 \cdot \left(1 + \frac{V_{DIG}(i)}{V_{REF}}\right)\right] <= L \text{ for } V_{DIG}(i) >= 0; \quad (2)$$

where $V_{DIG}$ is the output signal of the quantizer.

The number of capacitances $C_{jA}$ whose capacitor plate is connected to the negative reference voltage source $V_{REFN}$ during the integration phase is obtained using the following equation:

$$n(i) = \text{round}\left[L/2 \cdot \left(1 - \frac{V_{DIG}(i)}{V_{REF}}\right)\right] <= L \text{ for } V_{DIG}(i) <= 0; \quad (3)$$

where $V_{DIG}$ is the output signal of the quantizer. The total number of capacitances whose left capacitor plate in each case is connected to the positive reference voltage source during the integration phase and of capacitances whose left capacitor plate is connected to the negative reference voltage source $V_{REFN}$ during the integration phase is constant here.

$$p(i)+n(i)=L=\text{const.}, \quad (4)$$

where L is the total number of capacitors.

So that the total charge is fully integrated, all capacitors are connected to the input of the operational amplifier during the integration phase.

The load of the reference voltage sources $V_{REFP}$, $V_{REFN}$ with the prior art sigma-delta A/D converter shown in FIG. 2 is greatly signal-dependent.

For $V_{DIG}(i) \sim V_{INA}(i)$ and $V_{INA}(i) > 0$, the charge transfer at the positive reference voltage source caused by the analog input signal $V_{INA}(i)$ is calculated using the following equation:

$$|dq\_V_{REFP}(i)| = \qquad (5)$$

$$p(i) \cdot (V_{REFP} - V_{INA}(i)) \cdot C_{jA} = \text{round}\left[L/2 + L/2 \cdot \frac{V_{DIG}(i)}{V_{REF}}\right] \cdot$$

$$(V_{REFP} - V_{INA}(i)) \cdot C_{jA} \sim \left(L/2 \cdot V_{REF} - L/2 \cdot V_{INA}(i) + L/2 \cdot V_{DIG}(i) - L/2 \cdot \frac{V_{INA}(i) \cdot V_{DIG}(i)}{V_{REF}}\right) \cdot$$

$$C_{jA} \sim L/2 \cdot C_{jA} \cdot V_{REF} \cdot \left(1 - \frac{V_{INA}(i)^2}{V_{REF}}\right);$$

The charge transfer at the negative reference voltage source is obtained using the following equation:

$$|dq\_V_{REFN}(i)| = \qquad (6)$$

$$n(i) \cdot (|V_{REFP}| + V_{INA}(i)) \cdot C_{jA} = \left(L - \text{round}\left[L/2 + L/2 \cdot \frac{V_{DIG}(i)}{V_{REF}}\right]\right) \cdot$$

$$(|V_{REFN}| + V_{INA}(i)) \cdot \left(\sim \left(L/2 \cdot V_{REF} + L/2 \cdot V_{INA}(i) - L/2 \cdot V_{DIG}(i) \sim L/2 \cdot \frac{V_{INA}(i) \cdot V_{DIG}(i)}{V_{REF}}\right) \cdot$$

$$C_j \sim L/2 \cdot C_{jA} \cdot V_{REF} \cdot \left(1 - \frac{V_{INA}(i)^2}{V_{REF}^1}\right);$$

If both analog signal inputs $V_{INA}(i)$ and $V_{INB}(i)$ are included, the value and the effective current load of the reference voltage sources are doubled.

The effective current load of the reference voltage sources for the prior art sigma-delta A/D converter, as illustrated in FIG. 2, is then as follows:

$$Ceff_{VREF}(i) = L \cdot C_j \cdot \left(1 - \frac{(V_{INA}(i))^2}{V_{REF}^2}\right); \qquad (7)$$

The maximum effective load of the reference voltage sources is obtained with $V_{INA}(i) \sim 0$ and is:

$$Ceff\_\max\_V_{REF} = L \cdot C_j; \qquad (8)$$

The minimum value of the effective load of the reference voltage sources is obtained for the value $V_{INA}(i) \sim V_{REF}$:

$$Ceff\_\min\_V_{REF} = 0. \qquad (9)$$

As can be seen from the above equations, the current load of the reference voltage sources in the prior art sigma-delta A/D converter, as illustrated in FIG. 2, depends on the analog input signal. The signal-dependent load of the reference voltage sources leads to non-linear distortions and limits the resolution of the prior art sigma-delta A/D converter.

It is therefore the object of the present invention to create a sigma-delta A/D converter in which the current load of the reference voltage sources is minimal.

According to the invention, this object is achieved by a sigma-delta A/D converter having the features specified in Claim 1.

Further advantageous refinements of the sigma-delta A/D converter according to the invention emerge from the subclaims.

The invention creates a sigma-delta A/D converter having at least one analog signal input for applying an analog input signal, a subtraction element having a plurality of capacitors for sampling the input signal during a sampling phase, it being possible during an integration phase to switch the capacitors to reference voltage sources depending on control signals, an integrator for integrating the output signal of the subtraction element during the integration phase, a quantizer for analog-to-digital conversion of the output signal of the integrator for outputting a digitized output signal to a digital signal output, and having a control logic element for generating the control signals in such a way that the current load of the reference voltage sources is minimized during the integration phase.

In an advantageous refinement of the sigma-delta A/D converter according to the invention, first switching devices are switched by control signals of the control logic element to connect the reference voltage sources to the capacitors during the integration phase.

In a further advantageous refinement of the sigma-delta A/D converter according to the invention, second switching devices are switched by control signals of the control logic element to connect the capacitors to the analog signal input during a sampling phase.

In a further advantageous refinement of the sigma-delta A/D converter according to the invention, third switching devices are switched by control signals of the control logic element to connect the capacitors to the integrator during the integration phase.

The control signals are preferably generated depending on the digitized output signal of the quantizer, the potential difference between the reference voltage sources and the number of capacitors.

In a preferred embodiment of the sigma-delta A/D converter according to the invention, the capacitors have the same capacitance.

Three reference voltage sources are preferably provided.

In a preferred embodiment of the sigma-delta A/D converter according to the invention, a first reference voltage source having a reference potential, a second reference voltage source having a positive potential and a third reference voltage source having a negative potential are provided.

The negative potential of the third reference voltage source and the positive potential of the second reference voltage source are preferably symmetrical to the reference potential of the first reference voltage source.

The sigma-delta A/D converter according to the invention is preferably of a differential design with two analog signal inputs.

A low-pass filter is preferably connected downstream of the digital signal output.

In a preferred embodiment of the sigma-delta A/D converter according to the invention, the integrator has an operational amplifier and at least one integration capacitor.

The quantizer preferably has a relatively low signal resolution in comparison with the signal resolution of the sigma-delta A/D converter according to the invention.

The operational amplifier within the integrator preferably has a very high-resistance signal input.

A preferred embodiment of the sigma-delta A/D converter according to the invention is described below to illustrate the key features of the invention with reference to the attached drawings, in which.

Figure 1:
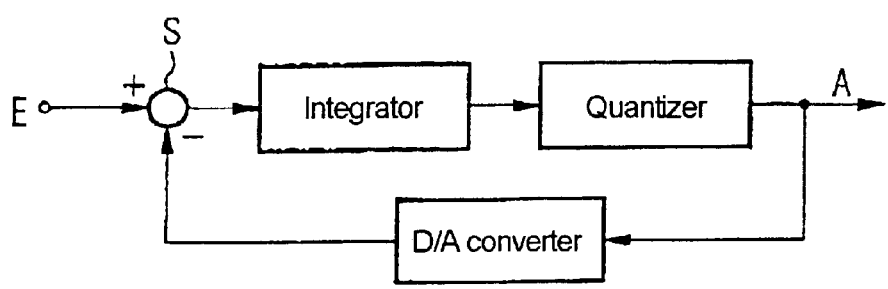
FIG. 1 shows a block circuit diagram of a conventional sigma-delta A/D converter.

The sigma-delta A/D converter according to the invention contains at least two analog signal inputs 1, 2 for applying analog input signals to a subtraction element or subtraction circuit 3 which contains a plurality of capacitors for sampling the analog input signals during a sampling phase. During an integration phase the capacitors contained in the subtraction element 3 are switched via lines 4, 5, 6 to reference voltage sources 7, 8, 9 depending on control signals. The sigma-delta A/D converter according to the invention also contains an integrator 10 which is connected on the input side to the subtraction element 3 via lines 11. The integrator temporally integrates the output signal output from the subtraction element 3 during the integration phase and outputs the integrated signal to a quantizer 13 via lines 12. The quantizer 13 performs analog-to-digital conversion of the output signal of the integrator 10 to output a digitized output signal to a digital signal output 14. The output 14 of the sigma-delta A/D converter according to the invention is fed back to the input of a control logic element 16 via a feedback line 15. The control logic element controls switching devices within the subtraction element 3 via control lines 17.

Figure 3:
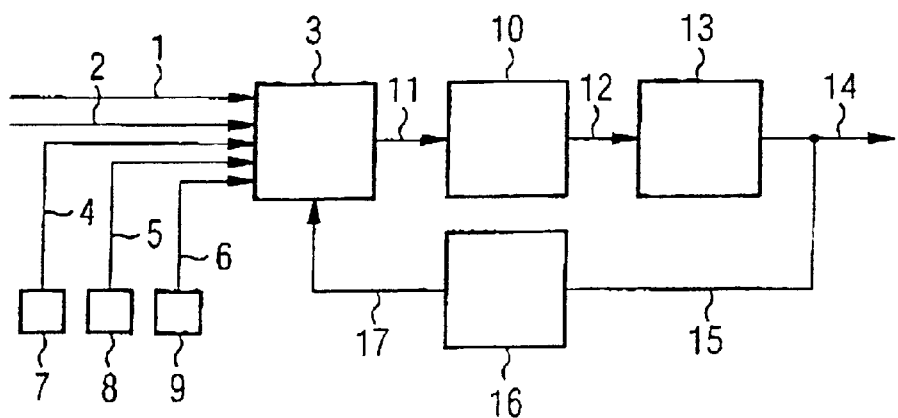
FIG. 3 shows a block circuit diagram of a sigma-delta A/D converter according to the invention.

In the preferred embodiment of the sigma-delta A/D converter according to the invention shown in FIG. 3, three reference voltage sources 7, 8, 9 are provided. The reference voltage source 7 is here preferably a positive reference voltage source having a positive potential, the second reference voltage source 8 has a reference potential and the third reference voltage source 9 is preferably a negative reference voltage source having a negative potential. The positive potential of the positive reference voltage source 7 and the negative potential of the negative reference voltage source 9 are preferably symmetrical to the reference potential of the reference voltage source 8. The reference potential is ground potential for example.

Figure 4:
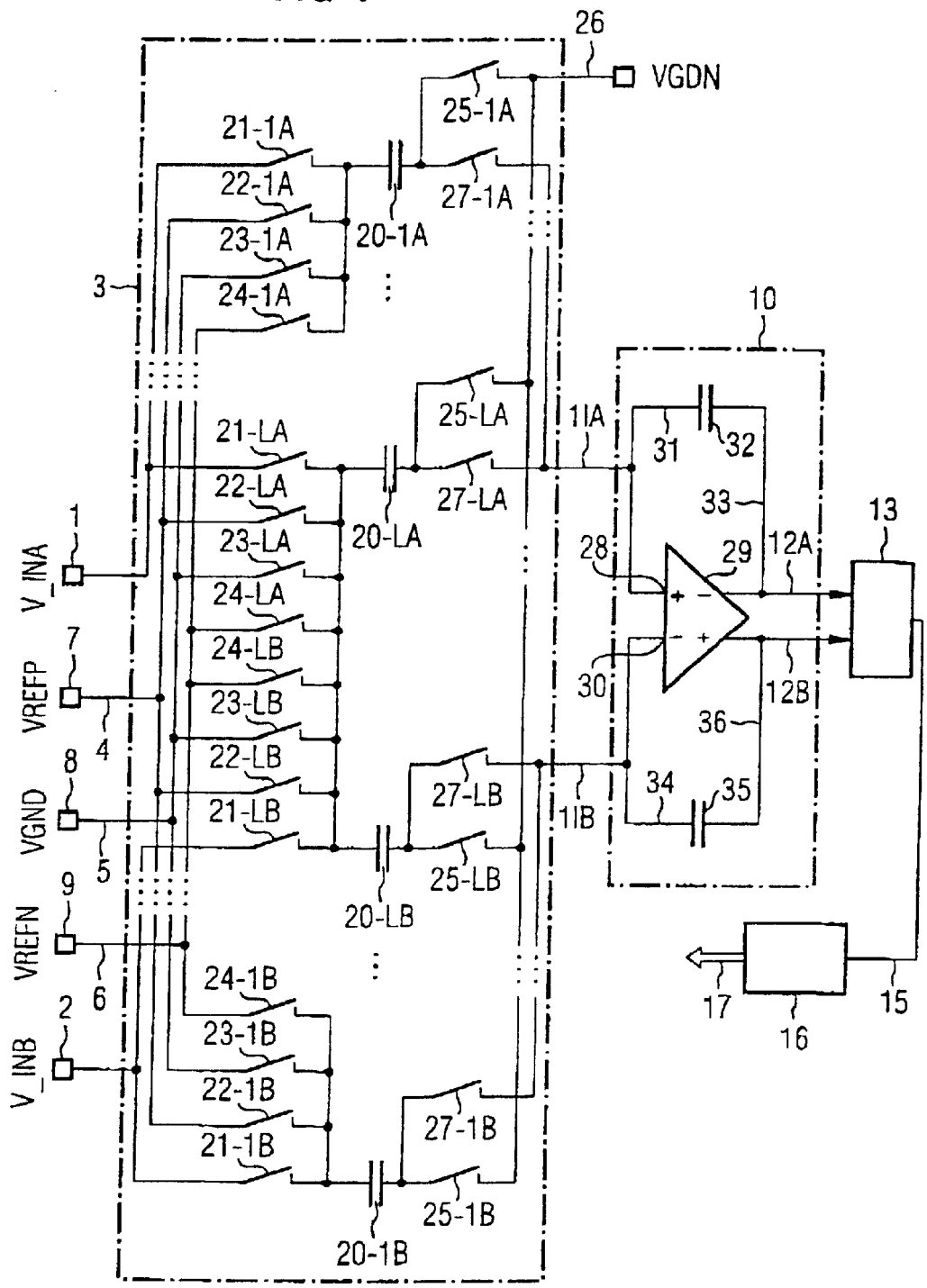
FIG. 4 shows a circuit diagram of a preferred embodiment of the sigma-delta A/D converter according to the invention.

FIG. 4 shows a circuit diagram of a preferred embodiment of the sigma-delta A/D converter according to the invention illustrated as a block circuit diagram in FIG. 3.

The subtraction element 3 contains a plurality of capacitors 20 for charge storage during a sampling phase. The first group of capacitors 20-1 A, 20-2 A . . . 20-L A can be switched by switching devices 21-1 A, 21-2 A . . . 21-L A to the first analog signal input 1, at which the analog signal $V_{INA}$ is present. The second group of capacitors 20-1 B, 20-2 B . . . 20-L B can be switched by switching devices 21-1 B, 21-2 B . . . 21-L B to the second analog signal input 2, at which the second analog input signal $V_{INB}$ is present.

The capacitors of the subtraction element 3 can also be connected on the input side by controllable switching devices 22-1 A, 22-2 A . . . 22-L A and 22-1 B, 22-2 B . . . 22-L B to the positive reference voltage source 7 via the line 4depending on control signals of the control logic element 16.

The capacitors can be switched by switching devices 23-1 A, 23-2 A . . . 23-L A and 23-1 B, 23-2 B . . . 23-L B to the second reference voltage source 8 via the line 5.

The capacitors can also be switched by switching devices 24-1 A, 24-2 A . . . 24-L A and 24-1 B, 24-2 B . . . 24-L B to the negative reference voltage source 9 via the line 6.

On the output side the capacitors of the subtraction element 3 can be switched by switching devices 25-1 A, 25-2 A . . . 25-L A and 25-1 B, 25-2 B . . . 25-L B to a common ground line 26.

The first group 20-1 A, 20-2 A . . . 20-L A of capacitors 20 of the subtraction element 3 can be connected by switching devices 27-1 A, 27-2 A . . . 27-L A via a line 11A to the non-inverting input 28 of the operational amplifier 29 within the integrator 10. The second group 20-1 B, 20-2 B . . . 20-L B can be connected by switching devices 27-1 B, 27-2 B . . . 27-L B via a line 11B to the inverting input 30 of the operational amplifier 29 within the integrator 10. The connecting line 11A between the subtraction element 3 and the integrator 10 is connected via a line 31 to a first integration capacitor 32 of the integrator 10, with the integration capacitor 32 being connected on the output side via a line 33 to the first output line 12A of the integrator 10.

The connecting line 11B between the subtraction element 3 and the integrator 10 is connected via a line 34 to a second integration capacitor 35 of the integrator 10, which is connected on the output side via a line 36 to the second output line 12B of the integrator 10. On the output side the operational amplifier 29 of the integrator 10 is connected to the quantizer 13 via the output lines 12A, 12B.

During the sampling phase all capacitors of the first group 20-1 A, 20-2 A . . . 20-L A are connected to the first analog signal input 1 by closing the switching devices 21-1 A, 21-2 A . . . 21-L A, and the second group of capacitors 20-1 B, 20-2 B . . . 20-L B are connected to the second analog signal input 2 by closing the switching devices 21-1 B, 21-2 B . . . 21-L B. The first group of capacitors 20-1 A, 20-2 A . . . 20-L A is charged during the sampling phase in accordance with the first analog input signal $V_{INA}$ and the second group of capacitors 20-1 B, 20-2 B . . . 20-L B is charged during the sampling phase in accordance with the second analog input signal $V_{INB}$. During the sampling phase, the switching devices 25-1 A, 25-2 A . . . 25-L A and 25-1 B, 25-2 B . . . 25-L B are closed so that the capacitors are connected on the output side to the ground line 26. Upon completion of the sampling phase, the capacitors are disconnected from the analog signal inputs by opening the switching devices 21-1 A, 21-2 A . . . 21-L A and 21-1 B, 21-2 B . . . 21-L B. At the same time the ground switching devices 25-1 A, 25-2 A . . . 25-L A and 25-1 B, 25-2 B . . . 25-L B are opened to disconnect the capacitors from the ground line 26. The switching devices are controlled by the control logic element via control lines 17.

In the ensuing integration phase, depending on the value of the digitized feedback signal applied to the lines 15, the left capacitor plates of the capacitors 20 are connected to the reference voltage sources 7, 8, 9 under the control of the control logic element 16. Depending on the digitized feedback signal applied, the control logic element 16 controls the switching devices 22 to connect to the positive reference voltage source 7, the switching devices 23 to connect the capacitors to the reference voltage source 8, and the switching devices 24 to connect the capacitors to the negative reference voltage source 9.

Upon completion of the integration phase, a fvoltage $V_{OUTP}(i)$ is present at the output of the integrator 10 between the lines 12A, 12B, which voltage depends on the preceding value $V_{OUTP}(i-1)$, the input voltage $V_{INA}(i-\frac{1}{2})$, the number n of capacitors whose left capacitor plate is connected to the negative reference voltage source during the integration phase, the number p of capacitors whose left plate is connected to the positive reference voltage source during the integration phase, and the number m of capacitors whose left capacitor plate is connected to the middle reference potential of the reference voltage source 8 during the integration phase.

The output voltage of the integrator 10 after completion of the integration phase $V_{OUTP}(i)$ is obtained using the following equation:

$$V_{OUTP}(i) = V_{OUTP}(i-1) + V_{INA}(i-1/2) \cdot \frac{L \cdot C_{jA}}{C_{int}} - \quad (10)$$

$$p(i) \cdot |V_{REFP}| \cdot \frac{C_{jA}}{C_{int}} + n(i) \cdot |V_{REFN}| \cdot \frac{C_{jA}}{C_{int}} - m \cdot V_{GND} \cdot \frac{C_{jA}}{C_{int}} =$$

$$V_{OUTP}(i-1) + V_{INA}(i-1/2) \cdot \frac{L \cdot C_{jA}}{C_{int}} -$$

$$(p(i) - n(i)) \cdot V_{REF} \cdot \frac{C_{jA}}{C_{int}} \text{ with } V_{REF} = V_{REFP} = |V_{REFN}|;$$

The number p of capacitors 20 whose left capacitor plate is connected to the positive reference voltage source 7 during the integration phase by closing the switches 22 is obtained using the following rule:

$$p(i) = \text{round}\left[L \cdot \frac{V_{DIG}(i)}{V_{REF}}\right] <= L, \quad (11)$$

$$m(i) = L - p(i), n(i) = 0 \text{ for } V_{DIG}(i) >= 0;$$

where $V_{DIG}(i)$ is the digitized output signal of the quantizer 13. The value is rounded to the nearest integer.

The number n of capacitors 20 whose left capacitor plate is connected to the negative reference voltage source during the integration phase is obtained using the following rule:

$$n(i) = \text{round}\left[L \cdot \frac{V_{DIG}(i)}{V_{REF}}\right] <= L m(i) = L - n(i), \quad (12)$$

$$p(i) = 0 \text{ for } V_{DIG}(i) <= 0;$$

where $V_{DIG}$ is the digitized output signal of the quantizer 13.

A total of (2L+1) different feedback values is obtained.

So that the charge can be fully integrated, during the integration phase all capacitors are connected to the operational amplifier 29 by the switching devices 27. Assuming $V_{DIG}(i) \sim V_{INA}(i)$, $V_{INA}(i)>0$, the current load of the reference voltage sources is:

$$|dq\_V_{REFP}(i)| = \quad (13)$$
$$p(i) \cdot (V_{REFP} - V_{INA}(i)) \cdot C_{jA} \sim L \cdot C_j \cdot \frac{V_{DIG}(i)}{V_{REF}} \cdot (V_{REFP} - V_{INA}(i));$$

$$|dq\_V_{GND}(i)| = \quad (14)$$
$$m(i) \cdot |(V_{GND} - V_{INA}(i))| \cdot C_{jA} \sim L \cdot C_{jA} \cdot \left(1 - \frac{V_{DIG}(i)}{V_{REF}}\right) \cdot V_{INA}(i);$$

$$|dq\_V_{REFN}(i)| = 0; \quad (15)$$

The differential load of the reference voltage sources is:

$$|dq\_V_{REFP}\_\text{diff}(i)| = \quad (16)$$
$$|dq\_V_{REFN}\_\text{diff}(i)| = |dq\_V_{REFP}(i)| + |dq\_V_{REFN}(i)| =$$
$$L \cdot C_j \cdot \frac{|V_{DIG}(i)|}{V_{REF}} \cdot (V_{REF} - |V_{INA}(i)|);$$

The charge transfer at the reference potential reference voltage source 8 caused by the first analog input signal $V_{INA}(i)$ and the second analog input signal $V_{INB}(i)$ cancel each other out:

$$|dq\_V_{GND}\text{diff}(i)|=0; \quad (17)$$

Accordingly, the effective load of the reference voltage sources in the sigma-delta A/D converter according to the invention is obtained:

$$Ceff_{VREF}(i) = L \cdot C_{jA} \cdot \frac{V_{DIG}(i)}{V_{REF}} \cdot (V_{REF} - |V_{INA}(i)|); \quad (18)$$

The maximum effective load of the reference voltage sources is obtained with:

$$|V_{DIG}(i)|\sim|V_{INA}(i)|\sim V_{REF}/2 \quad (19)$$

The maximum effective load of the reference voltage sources is here:

$$Ceff\_\text{max}\_V_{REF}=L/4 \cdot C_j; \quad (20)$$

The minimum effective load of the reference voltage sources is obtained for:

$$|V_{DIG}(i)|\sim|V_{INA}(i)|\sim 0 \text{ or } V_{REF} \quad (21)$$

where the minimum effective load of the reference voltage sources is:

$$Ceff\_\text{min}\_V_{REF}=0. \quad (22)$$

Figure 2:
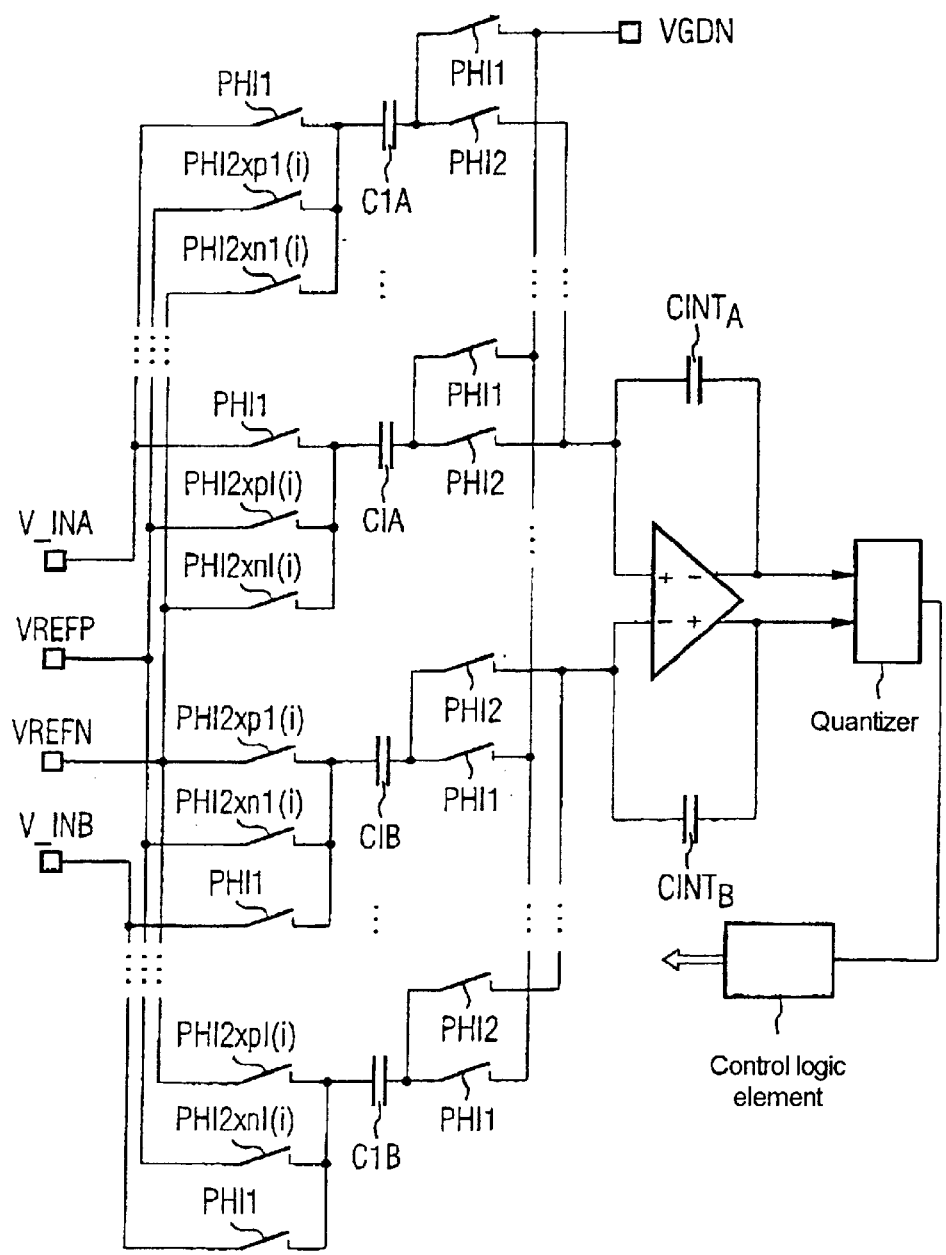
FIG. 2 shows a circuit diagram of a sigma-delta A/D converter employing SC circuitry according to the prior art.

As can be seen from the above equations, the maximum current load of the reference voltage sources is reduced by a factor of 4 in comparison with the prior art sigma-delta A/D converter as illustrated in FIG. 2. By reducing the maximum current load of the reference voltage sources, the signal-dependent non-linearities are significantly reduced. Conversely, the reference voltage sources can be dimensioned to be smaller by a factor of 4 for the same level of non-linearities. By reducing the load of the reference voltage sources, the non-linear distortions of the sigma-delta A/D converter according to the invention are significantly reduced in comparison with conventional sigma-delta A/D converters, and the resolution of the sigma-delta A/D converter according to the invention is increased.

In the sigma-delta A/D converter according to the invention, the load of the reference voltage sources is approximately 0, that is to say signal-independent, when input signals with a small signal amplitude $V_{INA}(i) \sim 0$ are applied.

A further advantage of the sigma-delta A/D converter according to the invention is that the number of possible feedback values is increased from (L+1) to (2L+1) different feedback values for the same number of capacitors 20 within the subtraction element 3.

Moreover, the sigma-delta A/D converter according to the invention, as illustrated in FIG. 4, has further additional advantageous features. By using the additional reference voltage source 8 with reference potential, with a differential implementation of the sigma-delta A/D converter according to the invention no non-linearities are produced in the case where the positive potential of the positive reference voltage source 7 is not symmetrical to the negative potential of the negative reference voltage source 9, that is to say when $(V_{REFP}-V_{GND})$ is not equal to $(V_{GND}-V_{REFN})$, as is demonstrated in the following equations:

$$d\_V_{OUTP}(i) = (V_{INA}(i-1/2) - V_{GND}) \cdot \frac{L \cdot C_{jA}}{C_{int}} - \quad (25)$$
$$p(i) \cdot (V_{REFP} - V_{GND}) \cdot \frac{C_{jA}}{C_{int}} - m(i) \cdot (V_{GND} - V_{GND}) \cdot \frac{C_{jA}}{C_{int}}$$

-continued $$d\_V_{OUTH}(i) = (V_{INB}(i-1/2) - V_{GND}) \cdot \frac{L \cdot C_{jA}}{C_{int}} -$$
$$p(i) \cdot (V_{REFN} - V_{GND}) \cdot \frac{C_{jA}}{C_{int}} - m(i) \cdot (V_{GND} - V_{GND}) \cdot \frac{C_{jA}}{C_{int}}$$

$$d\_V_{OUT}(i) = d\_V_{OUTP}(i) - d\_V_{OUTH}(i) =$$
$$(V_{INA}(i-1/2) - V_{INB}(i-1/2)) \cdot \frac{L \cdot C_{jA}}{C_{int}} -$$
$$p(i) \cdot (V_{REFP} - V_{REF} \cdot \frac{C_{jA}}{C_{int}};$$

In the preferred embodiment of the sigma-delta A/D converter according to the invention shown in FIG. 4, three reference voltage sources are provided.

With alternative embodiments, further reference voltage sources with further reference potentials may be used.

Another key feature of the sigma-delta A/D converter according to the invention is that the analog input signal ($V_{INA}$, $V_{INB}$) need no longer fully charge the capacitors 20 during the sampling phase. Rather the charge is balanced when the left capacitor plate of a capacitor is connected by the switching devices 21 to the analog input signal and the right capacitor plate of the capacitors 20 is connected by the switching devices 25 to the ground line 26.

The charging at the beginning of the sampling phase is:

$$q_{IN}(i+) = V_{DIG}(i) \times L \times C_j; \quad (26)$$

So that all capacitors are charged up to the charge $$q_{IN}(i+\tfrac{1}{2}) = V_{IN}(i+\tfrac{1}{2}) \cdot L \cdot C_j; \quad (27)$$

the analog input signal $V_{IN}(i)$ must supply the remaining charge:

$$d\_q_{IN}(i+\tfrac{1}{2}) = q_{IN}(i+\tfrac{1}{2}) - q_{IN}(i+) = [V_{IN}(i30\ \tfrac{1}{2}) - V_{DIG}(i)] L \cdot C_j \quad (28)$$

In the case of a high oversampling of the analog input signal by the sigma-delta A/D converter according to the invention and a high resolution with a large number of capacitors, the following approximation applies:

$$V_{DIG}(i) \rightarrow V_{IN}(i+\tfrac{1}{2}) \quad (29)$$

where the charge transfer approaches 0:

$$d\_q_{IN}(i) \rightarrow 0. \quad (30)$$

In this case the current load of the signal source is negligible and signal-independent.

Figure 5:
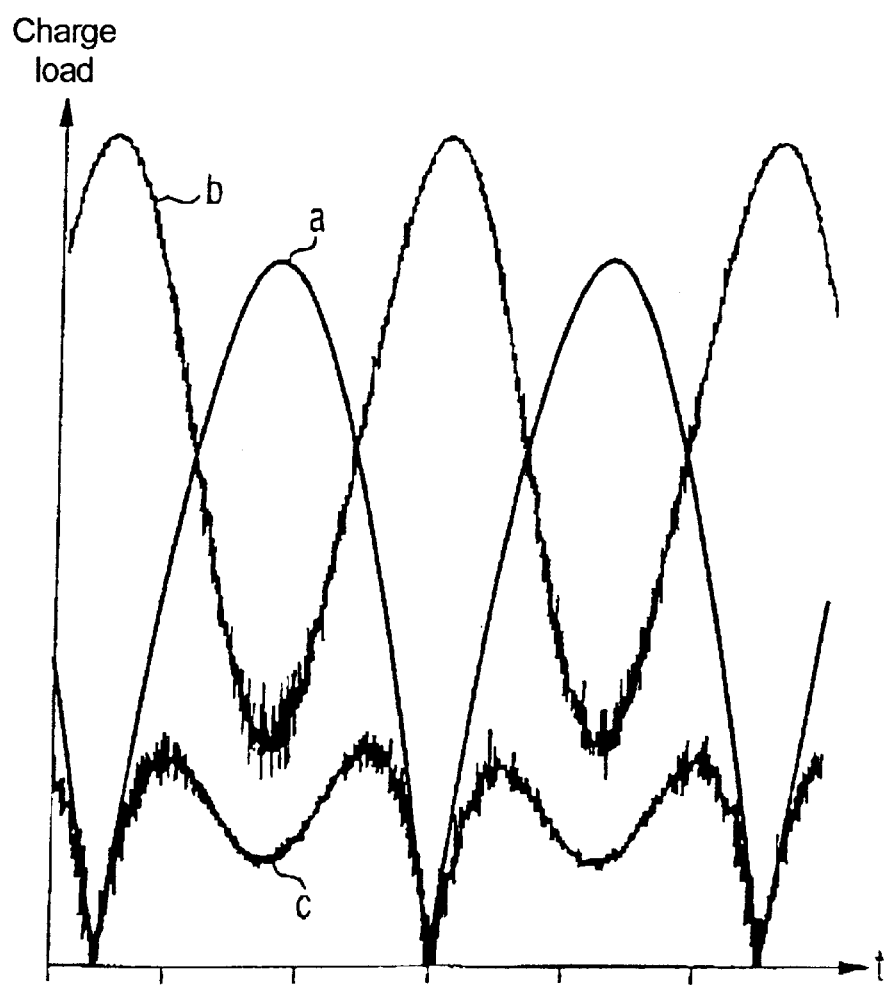
FIG. 5 shows a time sequence diagram for comparing the current load of the reference voltage sources in the sigma-delta A/D converter according to the invention against that of a conventional sigma-delta A/D converter.

FIG. 5 shows a time sequence diagram for illustrating the charge load of the reference voltage sources of the sigma-delta A/D converter according to the invention in comparison with a conventional sigma-delta A/D converter depending on the absolute value of an analog input signal.

The signal a represents the absolute value of an analog input signal. The example in FIG. 5 shows a sinusoidal analog input signal $V_{IN}$.

The curve b shows the charge load of a conventional prior art sigma-delta A/D converter as illustrated in FIG. 2.

The curve c shows the charge load of the reference voltage sources of the sigma-delta A/D converter according to the invention as shown in FIG. 4.

As can be seen by comparing the curves b and c, the charge load or the current load of the reference voltage sources in the sigma-delta A/D converter according to the invention is significantly reduced in comparison with conventional sigma-delta A/D converters. In the sigma-delta A/D converter according to the invention, the maximum current load of the reference voltage sources can be reduced by up to a factor of 4.

What is claimed is:

1. Sigma-delta A/D converter having
   at least one analog signal input for applying an analog input signal,
   at least one subtraction element having a plurality of capacitors for sampling the input signal during a sampling phase, it being possible during an integration phase to switch the capacitors to reference voltage sources depending on control signals,
   at least one integrator for integrating the output signal of the subtraction element during the integration phase,
   a quantizer for analog-to-digital conversion of the output signal of the integrator for outputting a digitized output signal to a digital signal output, and having
     a control logic element for generating the control signals in such a way that the current load of the reference voltage sources is minimized during the integration phase.

2. Sigma-delta A/D converter according to claim 1, characterized in that the control signals switch first switching devices for connecting the capacitors to the analog signal input during sampling phase.

3. Sigma-delta A/D converter according to claim 1, characterized in that the control signals switch second switching devices for connecting the reference voltage sources to the capacitors during the integration phase.

4. Sigma-delta A/D converter according to claim 1, characterized in that the control signals switch third switching devices for connecting the capacitors to the integrator during the integration phase.

5. Sigma-delta A/D converter according to claim 1, characterized in that the control signals are generated depending on the digitized output signal of the quantizer, the potential difference between the reference voltage sources and the number of capacitors.

6. Sigma-delta A/D converter according to claim 1, characterized in that the capacitors have the same capacitance in each case.

7. Sigma-delta A/D converter according to claim 1, characterized in that three reference voltage sources are provided.

8. Sigma-delta A/D converter according to claim 1, characterized in that the first reference voltage source has a positive potential, the second reference voltage source has a reference potential and the third reference voltage source has a negative potential.

9. Sigma-delta A/D converter according to claim 8, characterized in that the positive potential of the first reference voltage source and the negative potential of the third reference voltage source are symmetrical to the reference potential of the second reference voltage source.

10. Sigma-delta A/D converter according to claim 1, characterized in that the sigma-delta A/D converter is of a differential design with two analog signal inputs.

11. Sigma-delta A/D converter according to claim 1, characterized in that a low-pass filter is connected downstream of the digital signal output.

12. Sigma-delta A/D converter according to claim 1, characterized in that the integrator has an operational amplifier and at least one integration capacitor.

13. Sigma-delta A/D converter according to claim 1, characterized in that the quantizer has a low signal resolution.

14. Sigma-delta A/D converter according to claim 1, characterized in that the operational amplifier has a high-resistance signal input.

* * * * *